United States Patent
Wagner et al.

(10) Patent No.: US 9,548,227 B2
(45) Date of Patent: Jan. 17, 2017

(54) MICROWAVE INDUCED PLASMA DECAPSULATION USING A DIELECTRIC PLASMA DISCHARGE TUBE

(71) Applicant: Nisene Technology Group, Watsonville, CA (US)

(72) Inventors: Alan M. Wagner, Watsonville, CA (US); Ravin Krishnan, Johor (MY)

(73) Assignee: Nisene Technology Group, Watsonville, CA (US)

( * ) Notice: Subject to any disclaimer, the term of this patent is extended or adjusted under 35 U.S.C. 154(b) by 0 days.

(21) Appl. No.: 14/515,437

(22) Filed: Oct. 15, 2014

(65) Prior Publication Data
US 2015/0118856 A1 Apr. 30, 2015

Related U.S. Application Data

(60) Provisional application No. 61/897,800, filed on Oct. 30, 2013.

(51) Int. Cl.
*C23C 16/00* (2006.01)
*C23F 1/00* (2006.01)
(Continued)

(52) U.S. Cl.
CPC ... *H01L 21/67126* (2013.01); *H01J 37/32192* (2013.01); *H01L 21/31138* (2013.01); *H01L 21/56* (2013.01); *H01L 21/67069* (2013.01)

(58) Field of Classification Search
CPC .......... H01J 37/32192–37/32311; H05H 1/46; H05H 2001/4615; H05H 2001/4622; H05H 2001/463; H01L 21/67069
(Continued)

(56) References Cited

U.S. PATENT DOCUMENTS 4,512,868 A   4/1985   Fujimura et al.
4,673,456 A * 6/1987   Spencer et al. .......... 156/345.36
(Continued)

FOREIGN PATENT DOCUMENTS

FR      2677841      * 12/1992   ............. C23C 16/50
WO   2010055862        5/2010
(Continued)

OTHER PUBLICATIONS

Tang et al. "Microwave Induced Plasma decapsulation of thermally stressed multi-tier copper wire bonded IC packages." Electronic Packaging Technology (ICEPT), 2013 14th International Conference on. IEEE, 2013.
(Continued)

*Primary Examiner* — Rakesh Dhingra
(74) *Attorney, Agent, or Firm* — Van Pelt, Yi & James LLP (57) ABSTRACT

A microwave induced plasma decapsulation system and method for decapsulation a packaged semiconductor device applies a microwave induced plasma effluent along with etchant gases electrons, ions and free radicals that are chemically reactive to remove the epoxy molding compound encapsulating the semiconductor device. In one embodiment, the decapsulation system utilizes a microwave generator and a coaxial plasma source. In another embodiment, the decapsulation system utilizes a microwave generator, an electromagnetic surface wave plasma source, and a dielectric plasma discharge tube.

10 Claims, 8 Drawing Sheets

(51) Int. Cl.
*H01L 21/306* (2006.01)
*H01L 21/67* (2006.01)
*H01L 21/311* (2006.01)
*H01J 37/32* (2006.01)
*H01L 21/56* (2006.01)

(58) Field of Classification Search
USPC . 118/723 MW, 723 ME, 723 R; 156/345.35, 156/345.36, 345.41
See application file for complete search history.

(56) References Cited

U.S. PATENT DOCUMENTS

| | | | |
|---|---|---|---|
| 4,810,933 A * | 3/1989 | Moisan | H05H 1/46 219/750 |
| 5,262,610 A * | 11/1993 | Huang et al. | 219/121.43 |
| 5,792,314 A | 8/1998 | Shima et al. | |
| 6,776,874 B2 * | 8/2004 | Kobayashi et al. | 156/345.51 |
| 2002/0043342 A1 * | 4/2002 | Taniguchi et al. | 156/345.41 |
| 2002/0185226 A1 | 12/2002 | Lea et al. | |
| 2003/0119328 A1 * | 6/2003 | Fujisato | 438/709 |
| 2004/0238123 A1 * | 12/2004 | Becknell et al. | 156/345.33 |
| 2004/0248404 A1 * | 12/2004 | Subrahmanyan et al. | 438/637 |
| 2005/0224181 A1 | 10/2005 | Merry et al. | |
| 2006/0071607 A1 * | 4/2006 | Chen et al. | 315/111.01 |
| 2007/0065594 A1 * | 3/2007 | Chiang et al. | 427/533 |
| 2010/0180819 A1 * | 7/2010 | Hatanaka et al. | 118/719 |
| 2011/0114261 A1 | 5/2011 | Matsumoto et al. | |
| 2011/0215722 A1 | 9/2011 | Pelletier et al. | |
| 2011/0266257 A1 | 11/2011 | Nishizuka et al. | |
| 2013/0093321 A1 | 4/2013 | Yoshikawa et al. | |

FOREIGN PATENT DOCUMENTS

| | | |
|---|---|---|
| WO | 2011125524 | 10/2011 |
| WO | 2012146870 | 11/2012 |

OTHER PUBLICATIONS

"Copper wire bonded IC package decapsulation service and instruments" JIACO instruments webpage, accessed Oct. 28, 2013 at https://sites.google.com/a/jiacoinstruments.com/jiacoinstruments/home.

* cited by examiner

MICROWAVE INDUCED PLASMA DECAPSULATION USING A DIELECTRIC PLASMA DISCHARGE TUBE

CROSS REFERENCE TO OTHER APPLICATIONS

This application claims priority to U.S. Provisional Patent Application No. 61/897,800, entitled MICROWAVE INDUCED PLASMA DECAPSULATION, filed Oct. 30, 2013, which is incorporated herein by reference for all purposes.

BACKGROUND OF THE INVENTION

Electronic devices with integrated circuit chips or semiconductor dies encapsulated in plastic packaging have been employed for some years. In the present description, an electronic device refers to a packaged semiconductor device incorporating one or more integrated circuit chips. Typically, an epoxy resin is molded around the semiconductor chip, a central portion of a lead frame and bonding wires or other connections between contact pads on the chip to inner lead fingers on the lead frame. It is sometimes necessary to decapsulate such a plastic-encapsulated package at least in part to allow for inspection, test and repair of the chip or the wire bonds to the chip, or the inner lead fingers, after the epoxy covering these elements is safely and effectively removed. In general, concentrated acids such as sulfuric and nitric acids or other solvents for the resin have been used in a decapsulation system for removing plastic material to expose the encapsulated chip or package elements.

Epoxy molding compounds have been used extensively as an encapsulation material for semiconductor devices. Epoxy molding compounds are at times classified as trade secrets by device manufacturers as the epoxy molding compound supports the reliability of the semiconductor die and ensures performance in harsh operational environments. The standard composition of a semiconductor epoxy molding compound can include an epoxy resin, a hardener, an accelerator, a filler, coupling compound, flame retardant compound, a coloring agent, and a releasing compound. The main content of the epoxy molding compound is the silica fillers which are important as the fillers determine the reliability of the semiconductor device, including characteristics such as the moisture tolerance and temperature conductivity during operation. The fillers can constitute up to 75% to 90% of the total weight of the epoxy molding compound used for the encapsulation of a semiconductor device.

Although an electronic device may be packaged in a variety of ways using different types of encapsulation materials, the present description is concerned with electronic devices that are encapsulated in plastic packaging or other types of resinous materials. That is, the electronic device includes plastic encapsulation covering at least the chip(s), a central portion of a lead frame and bond wires connecting the chip(s) to the lead frame. Bond wires are made of various conductive materials, with copper (Cu) bond wires and gold (Au) bond wires being most commonly used. The electronic device also includes leads or lead fingers projecting out of the plastic encapsulation where the leads or lead fingers are used to form electrical connections from the outside world to the integrated circuit chip(s) encapsulated therein.

Besides gold and copper bond wires, palladium coated Cu wire, with about 0.08 μm layer of palladium over copper has also been used. Furthermore, silver alloy (Ag Alloy) has also been used as an alternative to gold bond wires as alloying silver has been useful in eliminating the silver migration phenomenon. Ag alloy wires have low Young's modulus, hardness properties, low cost compared to Au and PdCu bond wires and have bonding hardness similar to Au wire bonding which lead device manufacturers to make use of Ag alloy bond wires.

As described above, concentrated acids such as sulfuric and nitric acids or other solvents for the resin have been used in a decapsulation system for removing the epoxy molding compound material to expose the encapsulated chip or package elements. The conventional decapsulation process is an entirely wet etch process. The wet-etch decapsulation process has its limitations when semiconductor devices employ Cu and Ag based bond wires. Copper and silver alloy bond wires tend to suffer from etch damage when subjected to the conventional web-etch based decapsulation process.

Plasma etching is a dry etch process employed in semiconductor fabrication processes to etch or remove materials from a semiconductor chip, such as silicon, silicon oxide, silicon nitride or metallization materials. Plasma etching is carried out in a vacuum chamber where the plasma source is often excited by a radio frequency power source. Plasma etching is accomplished by ion bombardment and chemical reaction. Reactive-ion etching (RIE) is a plasma etch process commonly employed in semiconductor failure analysis for deprocessing a completed semiconductor die. RIE is typically carried out at a high frequency (e.g. 13.56 MHz). Attempts have been made to use RIE plasma etch system for plastic package decapsulation. However, using RIE plasma etch system for decapsulation is not practical as the decapsulation process could take several hours. During such a decapsulation process, the semiconductor device is subjected to high temperature which may have the undesired consequence of healing bake recoverable failures on the semiconductor die.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a microwave induced plasma decapsulation system and method for decapsulation a packaged semiconductor device applies a microwave induced plasma effluent along with etchant gases electrons, ions and free radicals that are chemically reactive to remove the epoxy molding compound encapsulating the semiconductor device.

In some embodiments, the microwave induced decapsulation system utilizes a microwave generator and a coaxial plasma source. In the present description, a decapsulation system using a coaxial plasma source (CPS) is referred to as a CPS microwave induced plasma decapsulation system. In some embodiments, the coaxial plasma source is implemented using an electron cyclotron resonance (ECR) coaxial plasma source. In some embodiments, the CPS microwave induced plasma decapsulation system operates under an atmospheric pressure between $10^{-3}$ to $10^{-2}$ mbar.

In other embodiments, the microwave induced decapsulation system utilizes a microwave generator, an electromagnetic surface wave plasma source, and a dielectric plasma discharge tube. In the present description, a decapsulation system using an electromagnetic surface wave plasma source is referred to as a SURF microwave induced plasma decapsulation system. In some embodiments, the SURF microwave induced plasma decapsulation system operates under a low atmospheric pressure in the $10^{-1}$ to 10 mbar range.

In embodiments of the present invention, the microwave induced plasma decapsulation system is capable of a much higher etching rate than RF plasma systems and is able to decapsulate epoxy molding compound effectively with no damage to the bonding wires encapsulated therein and the aluminum bond pads on the semiconductor die. Since microwave ions have short travel life in any direction, the short travel life reduces the potential of mechanical damages that are often associated with the RIE plasma etch system where damages are often caused by ion bombardment and electrical stress. RIE systems do not provide the high radical flux that are essential for decapsulation of the epoxy molding compound.

Figure 1:
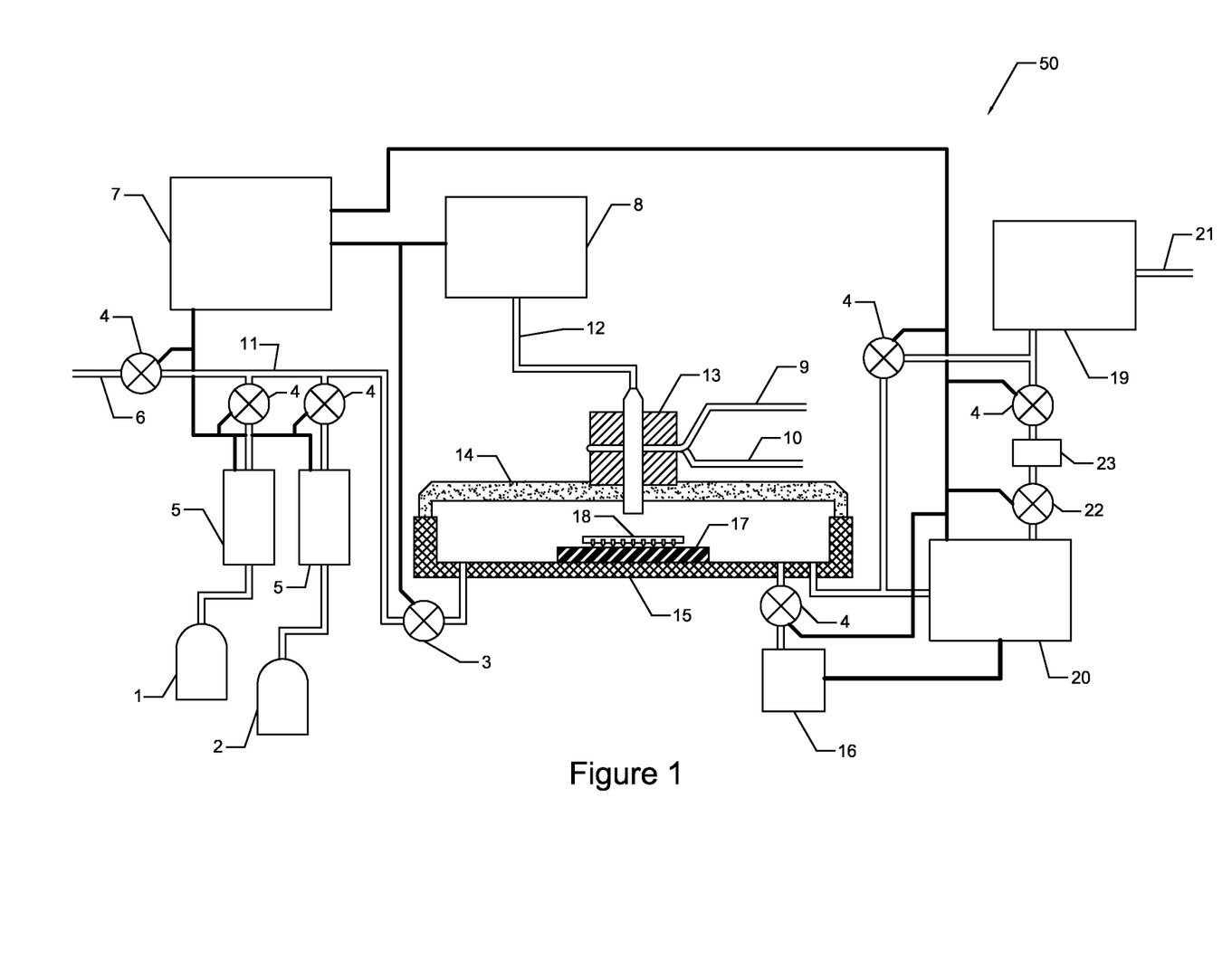
FIG. 1 illustrates a CPS microwave induced plasma decapsulation system according to embodiments of the present invention.

FIG. 1 illustrates a CPS microwave induced plasma decapsulation system according to embodiments of the present invention. Referring to FIG. 1, a CPS microwave induced plasma decapsulation system 50 includes a process chamber formed by a process housing chamber 15 and a movable process cover 14. The CPS microwave induced plasma decapsulation system 50 operates under a vacuum system including a vacuum pump 19 and a turbomolecular pump 23 to enhance the etching efficiency. The vacuum system is connected to the process chamber to evacuate the process chamber to a given vacuum pressure level, thereby forming a vacuum chamber. The vacuum range is dependent on process parameters or recipes that are designed taking into consideration of the contents of the epoxy molding compound, the epoxy molding compound thickness and also the type of bond wires being used. The pressure in the vacuum chamber is set and controlled from a system computer 7 via an absolute pressure transducer 16 (or pressure gauge 16) and a throttling valve 20. In embodiments of the present invention, a turbomolecular pump isolation gate value 22 may be provided between the turbomolecular pump 23 and the throttling valve 20.

Process gases are supplied to the process chamber from gas supply bottles 1, 2 through mass flow controllers 5, valves 4 and a main gas valve 3. For the CPS microwave induced plasma decapsulation system 50, the process gases (also referred to as "etchant gases") can include Oxygen ($O_2$) and Carbon tetrafluoride ($CF_4$). Oxygen ($O_2$) and carbon tetrafluoride ($CF_4$) gases are added into the plasma as etchants. The process gas volume can be defined by the stage or level of epoxy molding compound etching and the bond wire type.

A device under test (DUT 18) or multiple devices can be placed on a load plate 17 on the bottom portion of the process chamber. In some embodiments, an adjustable device height stage is utilized to maintain the height ratio so as to have the device placed at the right level below the plasma discharge zone. The distance is selected depending on the etching power and can be selected via the system computer 7. Alternately, the load plate 17 on which the DUT 18 is placed may be a cooling device, such as a cooling chuck, operative to provide cooling to the DUT 18.

In operation, the vacuum system is activated to evacuate the process chamber to a predetermined vacuum pressure level to form a vacuum in the process chamber. A system program running on the system computer 7 will turn on a microwave generator 8 to the selected power. In one embodiment, the microwave generator 8 is a 2.45 GHz, 200 watt microwave generator. The microwave power is connected to a coaxial plasma source 13 by a coaxial cable 12 as the microwave supply line. In one embodiment, the coaxial cable 12 is a 50 Ω 10 mm diameter coaxial cable. The plasma source 13 is water cooled through cooling lines 9, 10 and is process interlock monitored. For instance, the cooling line 9 may form a cooling water inlet while the cooling line 10 may form a cooling water outlet. When plasma energy had been tuned on and the forward and reflected power are within the programmed limits, the etchant gases in the gas supply bottles 1, 2 are brought in the process chamber. A plasma discharge is formed in the process chamber through the interaction of the plasma source, the microwave power and the etchant gases. Microwave tuning can be performed automatically by the microwave generator 8 and the plasma source 13 can be tuned manually.

Figure 2:
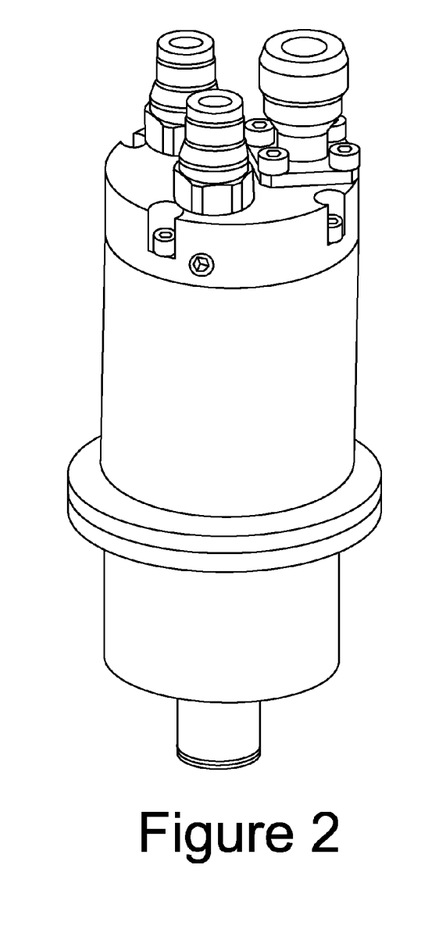
FIG. 2 illustrates an example of an ECR (electron cyclotron resonance) coaxial plasma source in embodiments of the present invention.

The coaxial plasma source (CPS) microwave induced plasma decapsulation system 50 operates under a high vacuum system in the range of $10^{-3}$ to $10^{-2}$ mbar. In embodiments of the present invention, the microwave generator 8 is a solid state microwave generator. Examples of solid state microwave generators are described in International application WO 2012/146870. In one embodiment, the plasma source 13 is an ECR (electron cyclotron resonance) coaxial plasma source. An ECR coaxial plasma source is available from Sairem, Neyron Cedex, France (www.sairem.com). FIG. 2 illustrates an example of an ECR (electron cyclotron resonance) coaxial plasma source in embodiments of the present invention.

The CPS microwave induced plasma decapsulation system 50 may include other components for completing the system. For example, the vacuum system 19 may include an exhaust line 21. Furthermore, the CPS microwave induced plasma decapsulation system 50 may include a source of dry nitrogen supply 6 provided on a supply line 11. The CPS microwave induced plasma decapsulation system 50 may include various valves 4 to control the flow of the nitrogen gas supply and the process gas supplies, or to control the gas flow in the vacuum system.

In the operation of the CPS microwave induced plasma decapsulation system 50, the plasma plume will be mixed with a predefined ratio of $O_2$ and $CF_4$. In some embodiments, the ratio of $O_2$ and $CF_4$ should not be more than 30% $CF_4$ in $O_2$. The $O_2$ radical will react with the epoxy molding compound plastic and plastic is etched (ashed) as the $O_2$ ionization occurs followed by the molecular dissociation and radical formation. The process active species are described below. The $O_2$ will not etch or react with the silica fillers and the silica will appear as a layer of agglomerate and this will hinder the $O_2$ radical from penetrating below this layer of silica. $CF_4$ is added to dissociate the agglomerate to particle that would be blown off by the flow pressure of the plasma flume or by ultrasonic cleaning.

The $O_2$ radicals generated in the plasma are efficient in etching the epoxy in the molding compound and the fluorine radicals are efficient in etching the silica fillers. The $O_2$ radical reactions or ash rate is greatly accelerated by introducing $CF_4$ as activated fluorine. $O_2$ in $CF_4$ plasma assist in decomposition of $O_2$ and $CF_4$ and the hydrocarbon surface of the epoxy molding compound.

Figure 3:
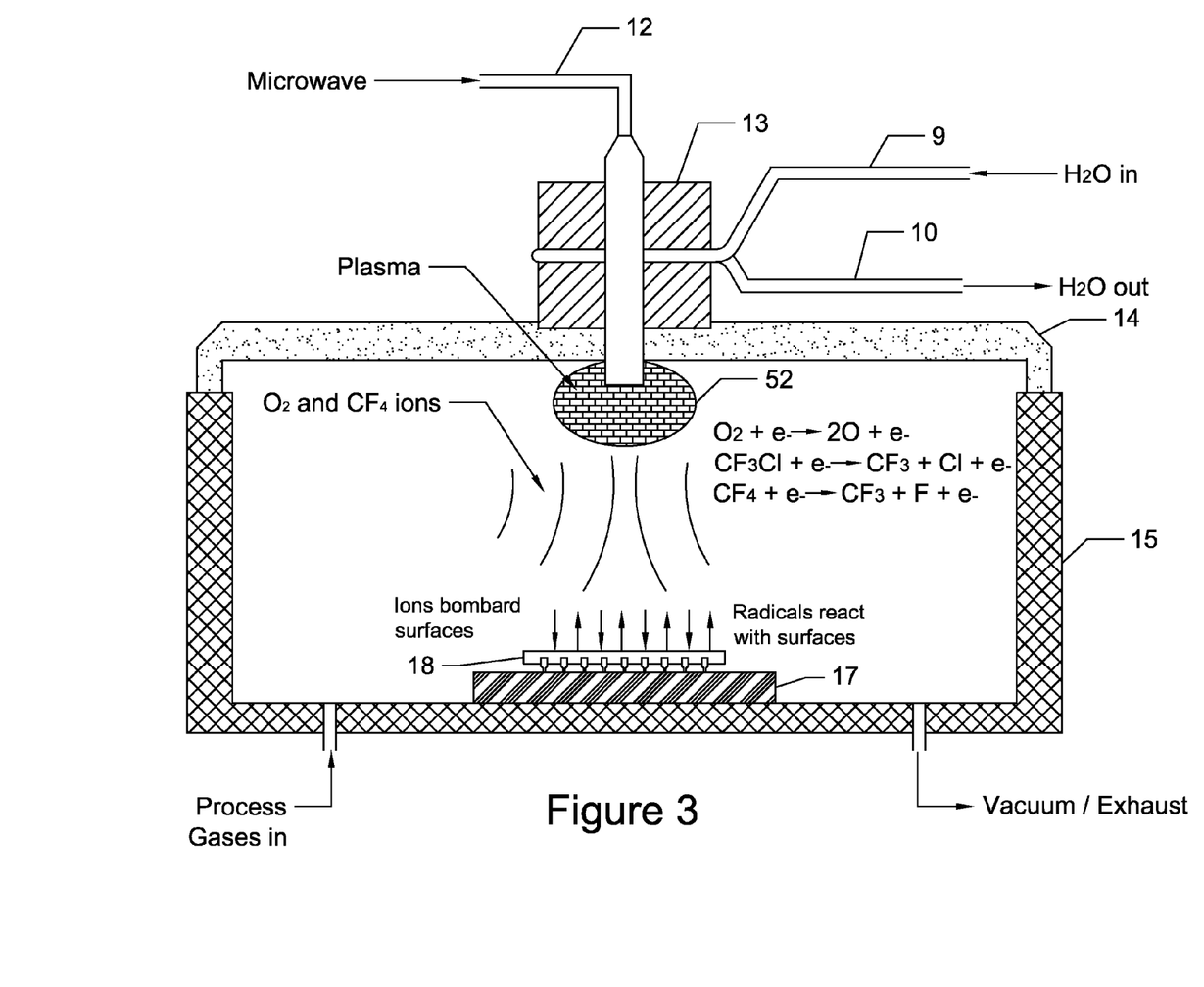
FIG. 3 illustrates the reactive species in the CPS microwave induced plasma decapsulation system of FIG. 1 and the process of decapsulation using the CPS microwave induced plasma decapsulation system.

FIG. 3 illustrates the reactive species in the CPS microwave induced plasma decapsulation system of FIG. 1 and the process of decapsulation using the CPS microwave induced plasma decapsulation system. As a result of the application of the microwave signal, the activation of the plasma source and the supply of the process gases, a microwave induced plasma 52 is generated in the process chamber. The plasma 52 generates ions that bombard the surface of to be etched and further generates radicals that react with the surface to be etched. In the present example, the process gases are Oxygen ($O_2$) and Carbon tetrafluoride ($CF_4$) and the process active species include:

$$O_2 + e- \rightarrow O_2^+ + 2e-$$

$$CF_4 + e- \rightarrow CF_3^+ + F + 2e-$$

$$CF_4 + e- \rightarrow CF_3^+ + F- + e-$$

$$O_2 + e- \rightarrow 2O + e-$$

$$CF_3Cl + e- \rightarrow CF_3 + Cl + e-$$

$$CF_4 + e- \rightarrow CF_3 + F + e-.$$

The ions is directed by the plasma 52 to bombard the exposed surface of DUT 18. Meanwhile, the radicals reacts with the exposed surface to enhanced the etch rate. In this manner, the exposed surface of the DUT 18 is subjected to the etching process.

In some embodiments, the CPS microwave induced plasma decapsulation system 50 generates a plasma in the entire etch chamber and all exposed surfaces of the device or devices in the chamber are subject to the etching process. Exposed materials that react with the active species in the plasma will be etched or ashed during the etch process. Selective etching of a portion of a device or portions of devices can be accomplished by masking the device or devices. For instance, to etch or decapsulate a selected area or shape, an aluminum foil tape can be placed over the DUT 18 over the protected area, that is, the area to be protected from etching. The aluminum foil tape will allow the radicals in the plasma plume to react only on the exposed area only. $O_2$ and $CF_4$ radicals do not react with the aluminum foil.

Figure 4:
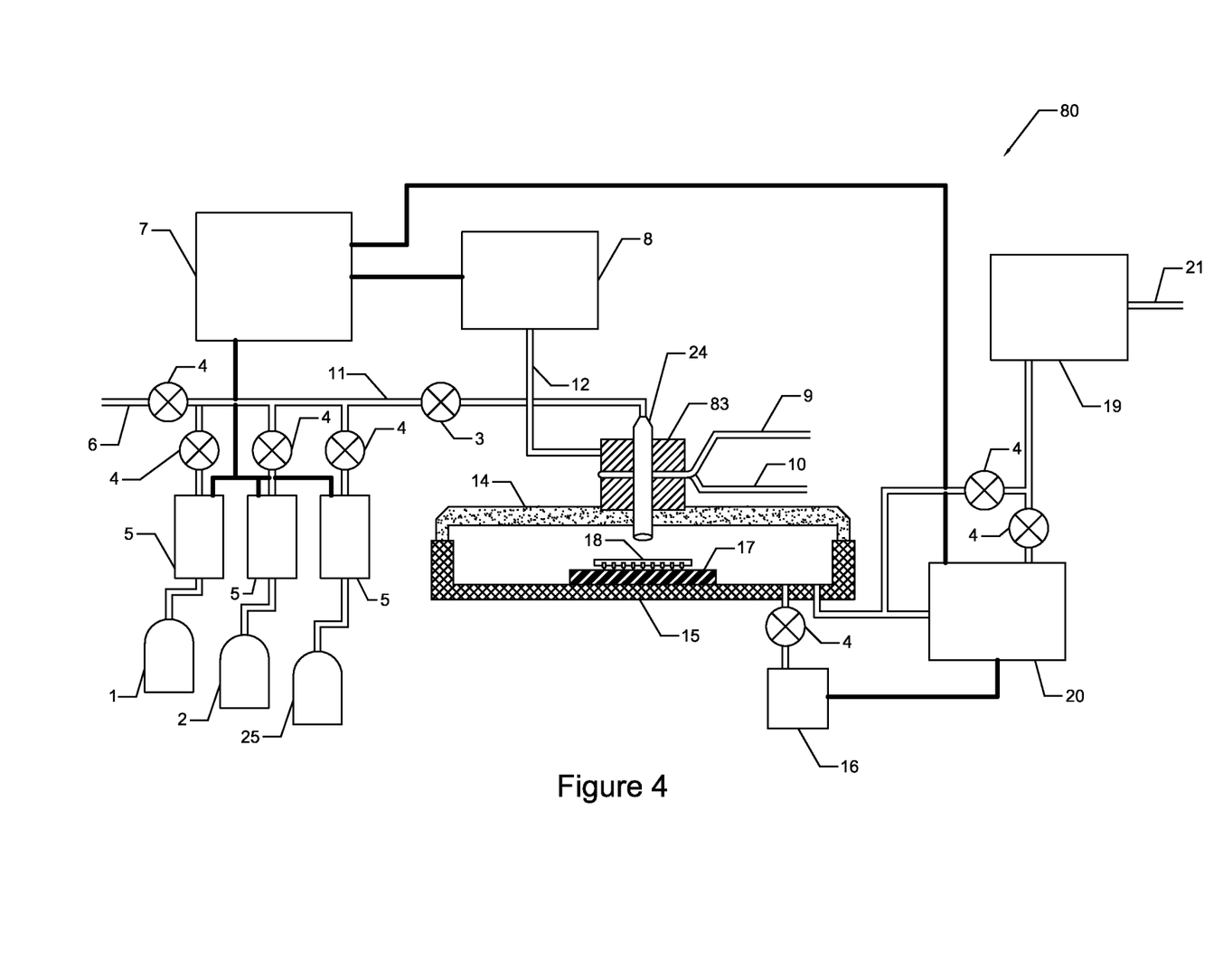
FIG. 4 illustrates a SURF microwave induced plasma decapsulation system according to embodiments of the present invention.

FIG. 4 illustrates a SURF microwave induced plasma decapsulation system according to embodiments of the present invention. Referring to FIG. 4, a SURF microwave induced plasma decapsulation system 80 includes a process chamber formed by a process housing chamber 15 and a movable process cover 14. The SURF microwave induced plasma decapsulation system 80 operates under a vacuum system including a vacuum pump system 19. The vacuum system is connected to the process chamber to evacuate the process chamber to a given vacuum pressure level, thereby forming a vacuum chamber. The vacuum range is dependent on process parameters or recipes that are designed taking into consideration of the contents of the epoxy molding compound, the epoxy molding compound thickness and also the type of bond wires being used. The pressure in the vacuum chamber is set and controlled from a system computer 7 via the absolute pressure transducer 16 (or pressure gauge 16) and the throttling valve 20. The SURF microwave induced plasma decapsulation system 80 further includes an electromagnetic surface wave plasma source 83 and a dielectric plasma discharge tube 24 coupled to the plasma source 83 to enhance the etching efficiency.

Process gases are provided from gas supply bottles 1, 2, and 25 through mass flow controllers 5, valves 4 and a main gas valve 3. In the SURF microwave induced plasma decapsulation system 80, the process gases are supplied to the plasma discharge tube 24. For the SURF microwave induced plasma decapsulation system 80, the process gases can include Argon (Ar), Oxygen ($O_2$) and Carbon tetrafluoride ($CF_4$). Oxygen ($O_2$) and carbon tetrafluoride ($CF_4$) gases are added into the plasma as etchants. Argon (Ar) is used as the plasma carrier gas. SURF plasma system requires a small volume of Ar to breakdown in vacuum and Ar is capable of increasing the plasma density. The process gas volume is defined by the stage or level of epoxy molding compound etching and the bond wire type. In some embodiments, the plasma carrier gas volume is set fixed.

A device under test (DUT 18) or multiple devices can be placed on a load plate 17 on the bottom portion of the process chamber. The DUT 18 may be placed a first distance away from the dielectric plasma discharge tube 24. The first distance is selected depending on the etching power selected via the computer 7. In some examples, the first distance is between 4 mm and 10 mm. In some embodiments, an adjustable device height stage is utilized to maintain the height ratio so as to have the device placed at the right level below the plasma discharge tube 24. Alternately, the load plate 17 on which the DUT 18 is placed may be a cooling chuck operative to provide cooling to the DUT 18.

In operation, the vacuum system is activated to evacuate the process chamber to a predetermined vacuum pressure level to form a vacuum in the process chamber. A system program running on the system computer 7 will call for the carrier gas first when the selected vacuum pressure has been attained and turn on a microwave generator 8 to the selected power. In one embodiment, the microwave generator 8 is a 2.45 GHz, 200 watt microwave generator. The microwave power is connected to the plasma source 83 by a coaxial cable 12 as the microwave supply line. In one embodiment, the coaxial cable 12 is a 50 Ω 10 mm diameter coaxial cable. The plasma source 83 is water cooled through cooling lines 9,10 and is process interlock monitored. For instance, the cooling line 9 may form a cooling water inlet while the cooling line 10 may form a cooling water outlet. When plasma energy had been tuned on and the forward and reflected power are within the programmed limits, the etchant gases are brought in through the plasma discharge tube 24. A plasma discharge is formed in the plasma discharge tube 24 through the interaction of the plasma source 83, the microwave power and the etchant gases. Microwave tuning can be performed automatically by the microwave generator 8 and the plasma source 83 can be tuned manually. Furthermore, the SURF plasma source 83 can be tuned by setting the correct gap and plunger distance within the surface wave launcher.

In the microwave plasma decapsulation system 80 of the present invention, the volume and flow rate of these gases are set in recipes and controlled by the mass flow controllers 5. The gas lines have a secondary safety valve 3 as the main gas valve that is linked with the system interlock.

Figure 5:
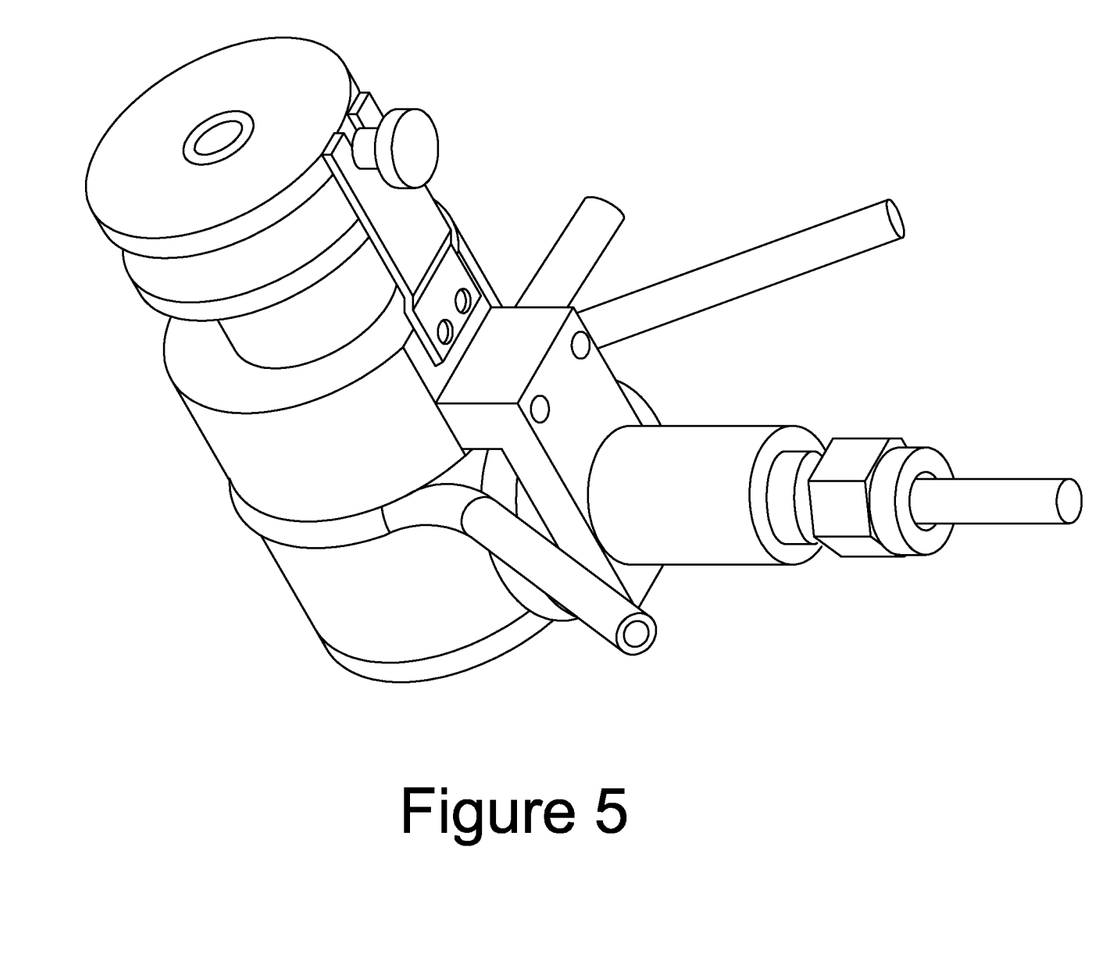
FIG. 5 illustrates an example of a surface wave launcher type plasma source in embodiments of the present invention.

The SURF microwave induced plasma decapsulation system 80 operates under a low pressure vacuum system 19 in the range of $10^{-1}$ to 10 mbar. In one embodiment, the plasma source 83 is a surface wave launcher type plasma source. A surface wave launcher type plasma source can be obtained from Sairem, Neyron Cedex, France (www.sairem.com). FIG. 5 illustrates an example of a surface wave launcher type plasma source in embodiments of the present invention.

The SURF microwave induced plasma decapsulation system 80 may include other components for completing the system. For example, the vacuum system 19 may include an exhaust line 21. Furthermore, the SURF microwave induced plasma decapsulation system 80 may include a source of dry nitrogen supply 6 provided on a supply line 11. The SURF microwave induced plasma decapsulation system 80 may include various valves 4 to control the flow of the nitrogen gas supply and the process gas supplies, or to control the gas flow in the vacuum system.

Figure 6:
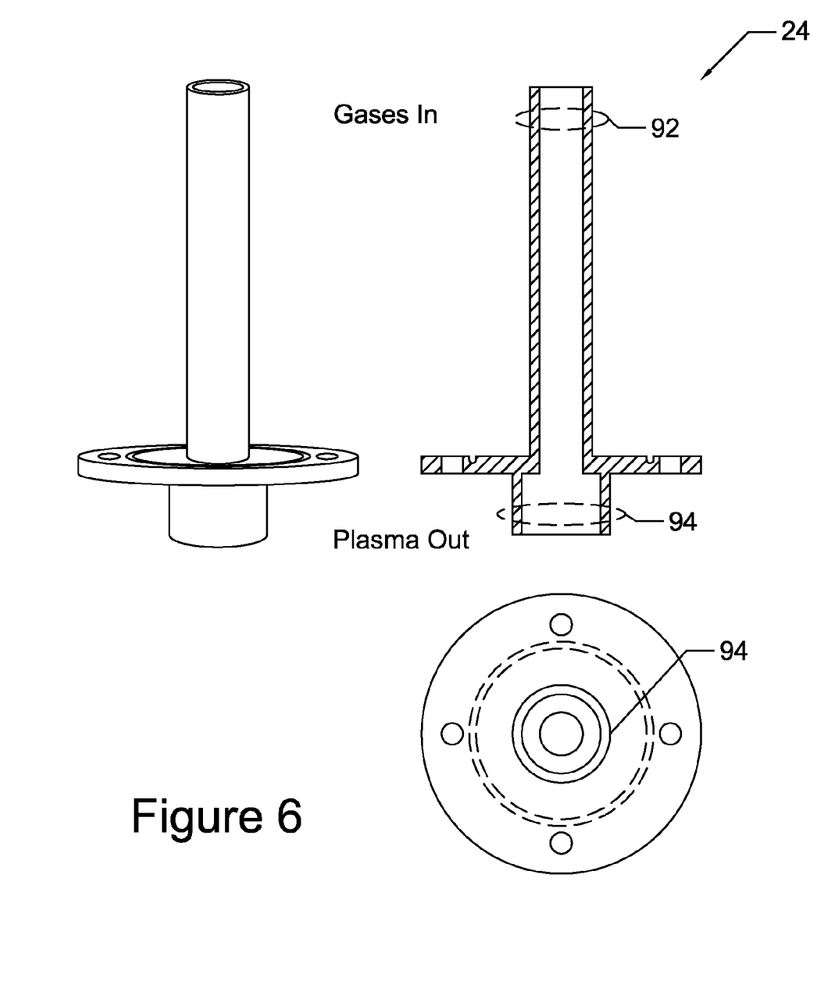
FIG. 6 illustrates the perspective view, the cross-sectional view and the bottom view of a plasma discharge tube in embodiments of the present invention.

The SURF microwave induced plasma decapsulation system 80 uses a dielectric plasma discharge tube 24. In one embodiment, the dielectric plasma discharge tube 24 is a ceramic or zirconia ($Al_2O_3$) plasma discharge tube, as shown in FIG. 6. FIG. 6 illustrates the perspective view, the cross-sectional view and the bottom view of a plasma discharge tube in embodiments of the present invention. Referring to FIG. 6, the plasma discharge tube 24 includes an inlet 92 for receiving process gases and an outlet 94 providing plasma output to the process chamber. In embodiments of the present invention, the plasma discharge tube 24 is made of a dielectric material so that the tube is transparent to the microwave. In embodiments of the present invention, the plasma discharge tube 24 is made of a dielectric material of 96% to 99% $Al_2O_3$. In other embodiments, other suitable dielectric materials may be used. The use of $Al_2O_3$ as the plasma discharge tube material provides advantage in temperature shielding. At the point of the gas break down, the temperature of the plasma (or the axis temperature) can be around 4000° C. With the $Al_2O_3$ dielectric plasma discharge tube, the external surface temperature at the plasma discharge location can be lowered to around 1000° C. The $Al_2O_3$ dielectric material has good thermal properties to support the high temperature, good dielectric strength and does not react with the process gases.

In embodiments of the present invention, the plasma discharge tube 24 is configured with an outlet 94 having an enlarged cross-section to support an extended working area of the plasma source. In particular, in some embodiments, the plasma source may support a limited working area (e.g. 8 mm). The dielectric plasma discharge tube 24 includes a tapered tube to extend the working area of the plasma source to realize a larger effective working area for the decapsulation system. For example, the dielectric plasma discharge tube 24 may realize a 12 mm effective working area through the enlarged outlet 94 using a plasma source with only 8 mm working area. In some embodiments, the plasma discharge tube 24 also serves as a vacuum seal for the process chamber.

Figure 7:
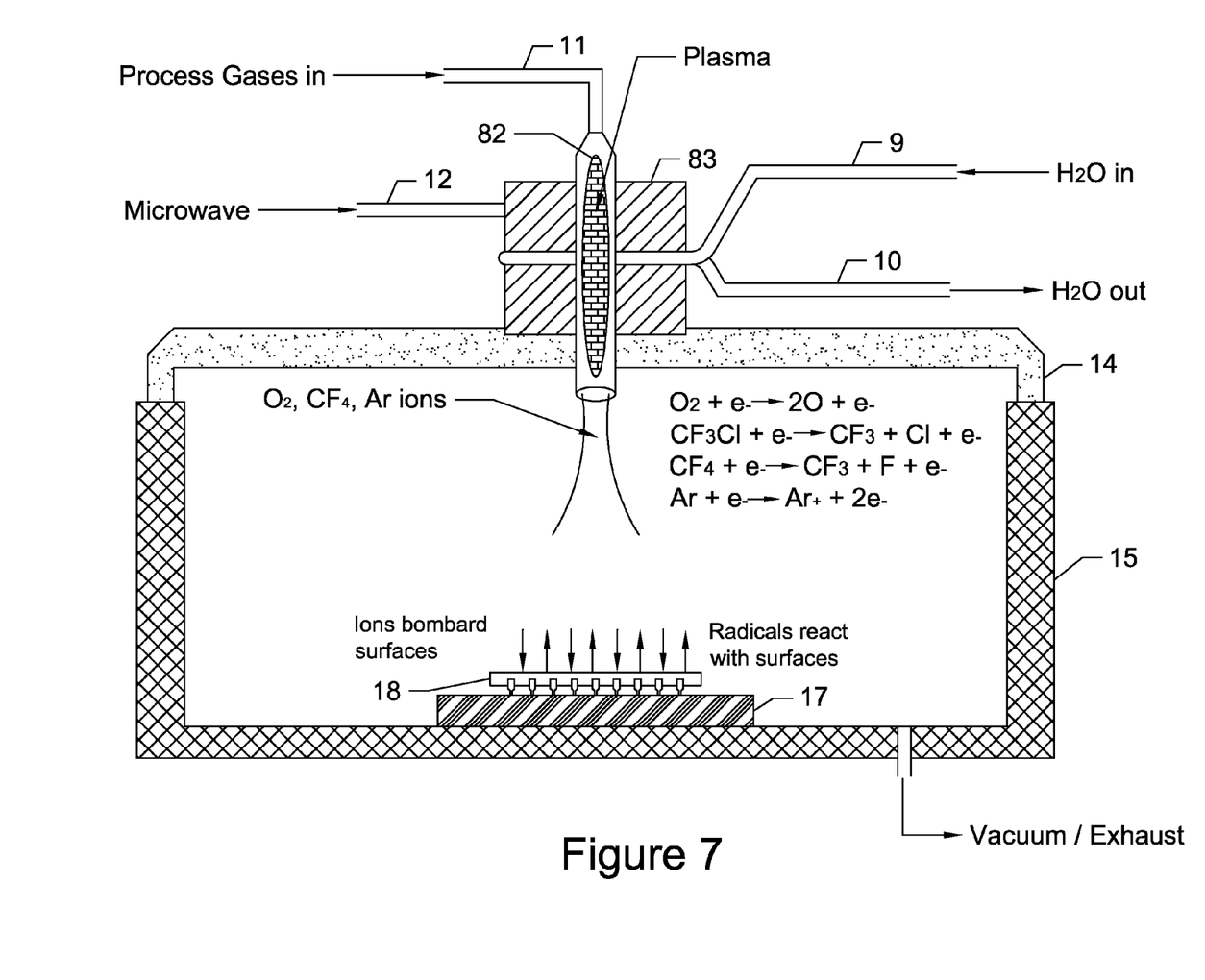
FIG. 7 illustrates the reactive species in the SURF microwave induced plasma decapsulation system of FIG. 4 and the process of decapsulation using the SURF microwave induced plasma decapsulation system.
Figure 8:
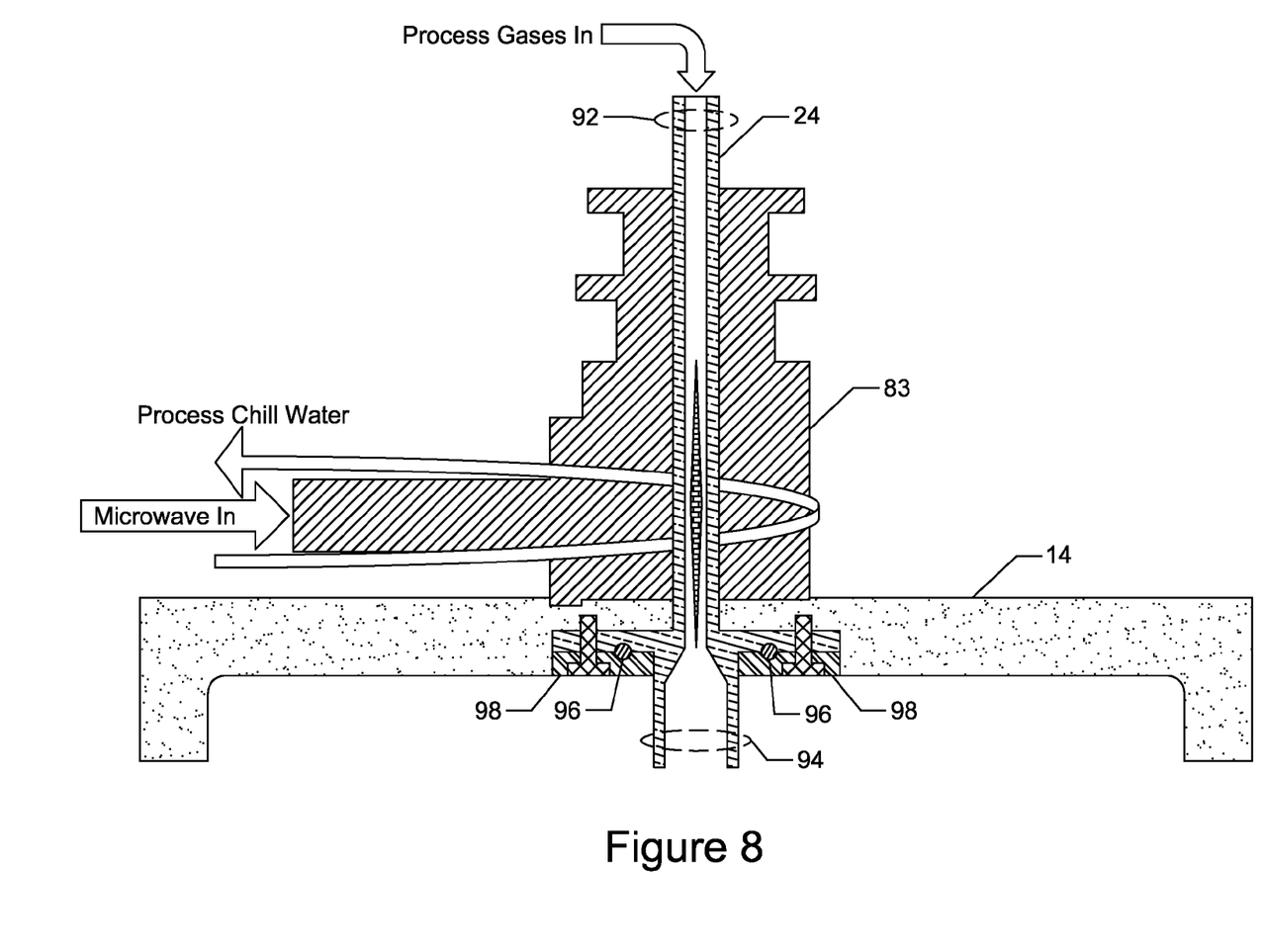
FIG. 8 further illustrates the process for plasma generation in the SURF microwave induced plasma decapsulation system of FIG. 4.

FIG. 7 illustrates the reactive species in the SURF microwave induced plasma decapsulation system of FIG. 4 and the process of decapsulation using the SURF microwave induced plasma decapsulation system. FIG. 8 further illustrates the process for plasma generation in the SURF microwave induced plasma decapsulation system of FIG. 4. Referring to FIGS. 7 and 8, the plasma discharge tube 24 is formed inside the plasma source 83. The plasma source 83 receives microwave power generated by the microwave generator. The plasma discharge tube 24 receives process gases at the inlet 92 and provides plasma output at outlet 94. Process chill water provides cooling of the plasma source 83. In some embodiments, the plasma discharge tube 24 includes a seal O ring 96 which engages the process cover 14 to serve as a vacuum seal for the process chamber. In some embodiments, the plasma discharge tube 24 may further include a bottom seal block 98 to provide further vacuum sealing.

In some embodiments, the SURF microwave induced plasma decapsulation system generates a plasma in the plasma discharge tube 24 and radicals emitted from the plasma discharge tube 24 are confined to a given working area in which etching can take place. Within the working area, exposed materials that react with the active species in the plasma will be etched or ashed during the etch process. Selective etching of a portion of a device or portions of devices can be accomplished by masking the device or devices. For instance, to etch or decapsulate a selected area or shape, an aluminum foil tape can be placed over the DUT over the protected area, that is, area to be protected from etching. The aluminum foil tape will allow the radicals in the plasma plume to react only on the exposed area only. Ar, $O_2$ and $CF_4$ radicals do not react with the aluminum foil.

In the operation of the SURF microwave induced plasma decapsulation system 80, the plasma plume will be mixed with a predefined ratio of $O_2$ and $CF_4$. For the SURF plasma system, the initial plasma plume is an argon plasma plume. In some embodiments, the ratio of $O_2$ and $CF_4$ should not be more than 30% $CF_4$ in $O_2$. The $O_2$ radical will react with the epoxy molding compound plastic and plastic is etched (ashed) as the $O_2$ ionization occurs followed by the molecular dissociation and radical formation. The process active species are described below. The $O_2$ will not etch or react with the silica fillers and the silica will appear as a layer of agglomerate and this will hinder the $O_2$ radical from penetrating below this layer of silica. $CF_4$ is added to dissociate the agglomerate to particle that would be blown off by the flow pressure of the plasma flume or by ultrasonic cleaning.

The $O_2$ radicals generated in the plasma are efficient in etching the epoxy in the molding compound and the fluorine radicals are efficient in etching the silica fillers. The $O_2$ radical reactions or ash rate is greatly accelerated by introducing $CF_4$ as activated fluorine. $O_2$ in $CF_4$ plasma assist in decomposition of $O_2$ and $CF_4$ and the hydrocarbon surface of the epoxy molding compound.

In some embodiments, the process active species are:

$$Ar+e- \rightarrow Ar^+ + 2e-$$

$$O_2+e- \rightarrow O_2^+ + 2e-$$

$$CF_4+e- \rightarrow CF_3^+ + F + 2e-$$

$$CF_4+e- \rightarrow CF_3^+ + F-+e-$$

$$O_2+e- \rightarrow 2O+e-$$

$$CF_3Cl+e- \rightarrow CF_3+Cl+e-$$

$$CF_4+e- \rightarrow CF_3+F+e-.$$

The ions is directed by the plasma 82 to bombard the exposed surface of DUT 18. Meanwhile, the radicals reacts with the exposed surface to enhanced the etch rate. In this manner, the exposed surface of the DUT 18 is subjected to the etching process.

In both the CPS and the SURF microwave induced plasma decapsulation systems, at the end of the etch process, the process chamber is purge by selecting the purge sequence at the computer 7 and the process chamber lid (or cover 14) can then be opened. During the purge sequence, the system will purge dry nitrogen $N_2$ into the process chamber and evacuate by the vacuum one or more times to eliminate any process byproduct that may remain. The purge sequence steps can be modified by the user for the number of purging before the cover 14 is open.

In some cases, the DUT is cleaned in an ultrasonic cleaning bath and can be further etched again if required.

In some examples, the plasma etching leaves an inverted spherical shaped opening in the area decapsulated. The depth and diameter of this opening depend on the plasma gas recipe and the etching time. In one embodiment, the system can etch an opening of a diameter of 12 mm with a focused plasma etch. When a larger etch area is required, an XYZ stage can be employed which carries the semiconductor device sample and moves it in accordance with the etching pattern that is programmed to evenly distribute the etching pattern resulting in a larger uniform etch cavity.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for selectively etching an encapsulant forming a package of resinous material around an electronic device comprising:
a source of process gases;
an etching assembly including an etch chamber and a movable top cover, the etch chamber and the movable top cover forming a process chamber;
a load plate formed in a bottom portion of the etch chamber, wherein an electronic device package is mountable in the etch chamber on the load plate;
a vacuum system coupled to the process chamber to evacuate the process chamber to a predetermined vacuum pressure level;
an electromagnetic surface wave plasma source coupled to the process chamber;
a microwave generator coupled to the plasma source and configured to generate a source of microwave power and to provide the microwave power to the plasma source; and
a dielectric plasma discharge tube coupled to the plasma source, the process gases being supplied to the dielectric plasma discharge tube, the dielectric plasma discharge tube comprising an inlet configured to receive the process gases and a plasma an outlet configured to provide the plasma discharge to the process chamber, the dielectric plasma discharge tube extending through the movable top cover so that the inlet is position positioned outside the process chamber while the plasma outlet is positioned inside the process chamber, the inlet comprising a cylindrical portion having a first uniform diameter and the plasma outlet comprising a cylindrical portion having a second uniform diameter greater than the first diameter, the plasma outlet having an enlarged cross-section to realize a plasma working area greater than a working area of the plasma source, the dielectric plasma discharge tube further comprising a flange portion positioned at a junction between the inlet and the plasma outlet, and a seal O ring and a bottom seal block engaging the flange portion and the movable top cover to provide a vacuum seal for the process chamber, wherein the flange portion has a diameter greater than the second uniform diameter of the plasma outlet and smaller than inner dimension of the movable top cover and the flange portion engages the movable top cover through the seal O ring and the bottom seal block to form the vacuum seal for the process chamber,
wherein, in response to the process chamber being evacuated to the predetermined vacuum pressure level, the microwave power being supplied at a predetermined power level to the plasma source, and the plasma source being turned on to a predetermined power level, the process gases are provided to the dielectric plasma discharge tube to generate a plasma discharge in the dielectric plasma discharge tube, the dielectric plasma discharge tube providing the plasma discharge to the process chamber through a plasma the outlet of the dielectric plasma discharge tube, the plasma discharge in the process chamber reacting with the resinous material forming the package of the electronic device to form an etch cavity on the exterior surface of the electronic device package.

2. The apparatus of claim 1, wherein the process gases comprises oxygen and carbon tetrafluoride.

3. The apparatus of claim 2, wherein the process gases comprises no more than 30% carbon tetrafluoride in oxygen.

4. The apparatus of claim 1, wherein the vacuum system is configured to evacuate the process chamber to a vacuum pressure level of $10^{-1}$ to 10 mbar.

5. The apparatus of claim 1, wherein the plasma source comprises a surface wave launcher type plasma source.

6. The apparatus of claim 1, further comprising a coaxial cable coupled to the microwave generator and the plasma source to provide the microwave power from the microwave generator to the plasma source.

7. The apparatus of claim 1, wherein the plasma source comprises a cooling line inlet and a cooling line outlet configured to receive cooling water for cooling the plasma source.

8. The apparatus of claim 1, wherein the load plate comprises an adjustable device height stage to position the electronic device package to a level below the dielectric plasma discharge tube.

9. The apparatus of claim 1, wherein the load plate comprises a cooling chuck.

10. The apparatus of claim 1, wherein the dielectric plasma discharge tube comprises one of ceramic or zirconia ($Al_2O_3$) plasma discharge tube.

* * * * *